(12) United States Patent
Inouye

(10) Patent No.: US 12,154,599 B2
(45) Date of Patent: Nov. 26, 2024

(54) PHONO CARTRIDGE TRANSMISSION LINE IMPEDANCE MATCHING SYSTEM AND METHOD

(71) Applicant: Brian James Inouye, Moncton (CA)

(72) Inventor: Brian James Inouye, Moncton (CA)

( * ) Notice: Subject to any disclaimer, the term of this patent is extended or adjusted under 35 U.S.C. 154(b) by 0 days.

(21) Appl. No.: 18/535,268

(22) Filed: Dec. 11, 2023

(65) Prior Publication Data

US 2024/0242735 A1 Jul. 18, 2024

(30) Foreign Application Priority Data

Jan. 17, 2023 (CA) .................... CA 3187009

(51) Int. Cl.
  *G11B 3/095* (2006.01)
  *G11B 20/10* (2006.01)
  *H03H 7/38* (2006.01)

(52) U.S. Cl.
  CPC ........ *G11B 3/095* (2013.01); *G11B 20/10388* (2013.01); *G11B 20/105* (2013.01); *G11B 20/10509* (2013.01); *H03H 7/383* (2013.01)

(58) Field of Classification Search
  None
  See application file for complete search history.

(56) References Cited

U.S. PATENT DOCUMENTS

| | | | | |
|---|---|---|---|---|
| 1,807,940 A * | 6/1931 | Stafford | ................. | G11B 17/00 369/2 |
| 2,080,554 A * | 5/1937 | Wolff | ....................... | H03G 3/24 455/238.1 |
| 2,519,063 A * | 8/1950 | Moir | ........................ | H04B 1/20 455/344 |
| 2,789,235 A * | 4/1957 | Shoaf | .................... | H04B 1/1623 318/770 |
| 3,133,989 A * | 5/1964 | Graef | ...................... | H03G 5/04 369/175 |
| 4,174,841 A * | 11/1979 | Cousin | ............... | G11B 3/08516 369/231 |
| 4,328,573 A * | 5/1982 | Kurtin | .................... | G01R 35/00 |
| 4,496,910 A * | 1/1985 | Strickland | ............... | H03F 3/185 |
| 4,779,170 A * | 10/1988 | Lockwood | ............. | G11B 33/10 362/86 |
| 5,955,670 A * | 9/1999 | Goodman | ............ | G01N 29/032 73/592 |
| 9,466,277 B1 * | 10/2016 | Myers | ...................... | G10H 3/14 |
| 2024/0242735 A1 * | 7/2024 | Inouye | ................. | G11B 20/105 |

* cited by examiner

*Primary Examiner* — Peter Vincent Agustin
(74) *Attorney, Agent, or Firm* — Bonini IP Law, LLC; Frank J. Bonini, Jr.

(57) ABSTRACT

A phono cartridge transmission line impedance matching system is provided. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances.

11 Claims, 8 Drawing Sheets

PHONO CARTRIDGE TRANSMISSION LINE IMPEDANCE MATCHING SYSTEM AND METHOD

FIELD OF THE INVENTION

The present invention relates to impedance matching systems, and more particularly to a system and method for accurately matching the impedance of a phono cartridge and its transmission line connected to an amplifying device.

BACKGROUND OF THE INVENTION

Ideally, a phono cartridge transmission line is terminated with an impedance that matches the combined impedance of its components, the phono cartridge, the tone-arm cabling, the interconnecting cabling, and the amplifying device's input. A properly matched transmission line termination substantially prevents signal reflections and power loss, whereas a transmission line termination mismatch causes signal reflections that produce numerous undesirable effects which cumulatively affect the overall frequency spectral response by way of standing waves, interference, and power loss.

It is important to note that the vinyl phono record is not recorded (cut) with a flat frequency response, but rather, with three time-constants (two zeros, and one pole), and in particular, with a rising high-frequency response that is boosted according to a Recording Industry Association of America (RIAA) standardized system, designed to improve the signal-to-noise ratio during normal record play. This high-frequency pre- and de-emphasis can produce a very distorted and strident upper-frequency sound when the phono cartridge is not accurately loaded.

Incorrect resistance loading limits the phono cartridge's performance, affecting the low- or the high-frequency response, or in some cases both. Over-compensation affects the speed of the phono cartridge's dynamic characteristics by over-dampening; under-compensation exacerbates the high-frequencies to the point of uncontrolled ringing.

In present-day applications, the phono cartridge transmission line is terminated by: the phono cartridge manufacturer pre-terminating the phono cartridge transmission line and enabling the user to terminate the transmission line by choosing between a few pre-selected termination values; or by enabling the user to terminate the transmission line by choosing between a limited number, typically less than 30, of termination values.

Furthermore, in order to change the termination value, the user has to shut down the phono player and the amplifying device, change the termination value, restart the phono player and the amplifying device, and listen again, thus resulting in a tedious and time consuming process until the best termination value has been found, which is further complicated by the fact that this process takes longer than the 15-30 seconds short-term sonic memory of the user.

It is desirable to provide a system and method that enables accurate matching of the impedance of a phono cartridge and its transmission line connected to an amplifying device.

It is also desirable to provide a system and method that enables precise adjustment of the resistance loading of a phono cartridge connected to an amplifying device.

It is also desirable to provide a system and method that enables precise adjustment of the resistance loading of a phono cartridge connected to an amplifying device during normal record play.

It is also desirable to provide a system and method that enables precise adjustment of the resistance loading of a phono cartridge connected to an amplifying device for a large variety of commercially available phono cartridges of different types.

SUMMARY OF THE INVENTION

Accordingly, one object of the present invention is to provide a system and method that enables accurate matching of the impedance of a phono cartridge and its transmission line connected to an amplifying device.

Another object of the present invention is to provide a system and method that enables precise adjustment of the resistance loading of a phono cartridge connected to an amplifying device.

Another object of the present invention is to provide a system and method that enables precise adjustment of the resistance loading of a phono cartridge connected to an amplifying device during normal record play.

Another object of the present invention is to provide a system and method that enables precise adjustment of the resistance loading of a phono cartridge connected to an amplifying device for a large variety of commercially available phono cartridges of different types.

According to one aspect of the present invention, there is provided a phono cartridge transmission line impedance matching system. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances.

According to the aspect of the present invention, there is provided a phono cartridge transmission line impedance matching system. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances. An input shunt resistor is interposed between the signal line and ground. Each resistance switching circuit comprises a plurality of resistors connected in series and a multi position selector switch connected to: nodes between adjacent resistors, a first node before a first resistor of the plurality of resistors; and a last resistor of the plurality of resistors, the multi position selector switch being adapted for selectively connecting one of the nodes to a switching output.

According to the aspect of the present invention, there is provided a phono cartridge transmission line impedance matching system. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances. An input shunt resistor is interposed between the signal line and ground. Each resistance switching circuit comprises a plurality of resistors connected in series and a multi position selector switch connected to: nodes between adjacent resistors, a first node before a first resistor of the plurality of resistors; and a last resistor of the plurality of resistors, the multi position selector switch being adapted for selectively connecting one of the nodes to a switching output. The switching output of the last resistance switching circuit of the plurality of resistance switching circuits is connected to ground and the switching output of each of the other resistance switching circuits is connected to the first node of a successive resistance switching circuit.

According to the aspect of the present invention, there is provided a phono cartridge transmission line impedance matching system. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances. The resistance switching circuits are determined such that the resistance values of successive resistance switching circuits increase by an order of ten. Each resistance switching circuit switches between ten resistance-load values (including zero) in equal increments.

According to the aspect of the present invention, there is provided a phono cartridge transmission line impedance matching system. The phono cartridge transmission line impedance matching system comprises a connecting port adapted for being connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances. Each switching circuit comprises a rotary switch having a control knob such that a control knob position is indicative of a respective resistance value.

According to the aspect of the present invention, there is provided a phono cartridge transmission line impedance matching method. The method comprises providing a phono cartridge transmission line impedance matching system. The phono cartridge transmission line impedance matching system comprises a connecting port connected to a signal line and a ground line of a phono cartridge transmission line. A capacitance switching circuit is connected to the signal line and the ground line in a parallel fashion. The capacitance switching circuit is adapted for selectively switching between different capacitances. A plurality of resistance switching circuits, connected with each other in a serial fashion, are connected to the signal line and the ground line in a parallel fashion. Each resistance switching circuit is adapted for selectively switching between different resistances. Using the capacitance switching circuit and the plurality of resistance switching circuits, the capacitance value and the resistance value are set to respective values recommended by a manufacturer of the phono cartridge. Using the phono cartridge, a user plays a record and listens to the record playback. Using the plurality of resistance switching circuits, the user adjusts the resistance value while listening to the record playback until the phono cartridge transmission line impedance is matched.

The advantage of the present invention is that it provides a system and method that enables accurate matching of the impedance of a phono cartridge and its transmission line connected to an amplifying device.

A further advantage of the present invention is that it provides a system and method that enables precise adjustment of the resistance loading of a phono cartridge connected to an amplifying device.

A further advantage of the present invention is that it provides a system and method that enables precise adjustment of the resistance loading of a phono cartridge connected to an amplifying device during normal record play.

A further advantage of the present invention is that it provides a system and method that enables precise adjustment of the resistance loading of a phono cartridge connected to an amplifying device for a large variety of commercially available phono cartridges of different types.

BRIEF DESCRIPTION OF THE DRAWINGS

A preferred embodiment of the present invention is described below with reference to the accompanying drawings, in which.

DESCRIPTION OF THE PREFERRED EMBODIMENT

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, the preferred methods and materials are now described.

Figure 1:
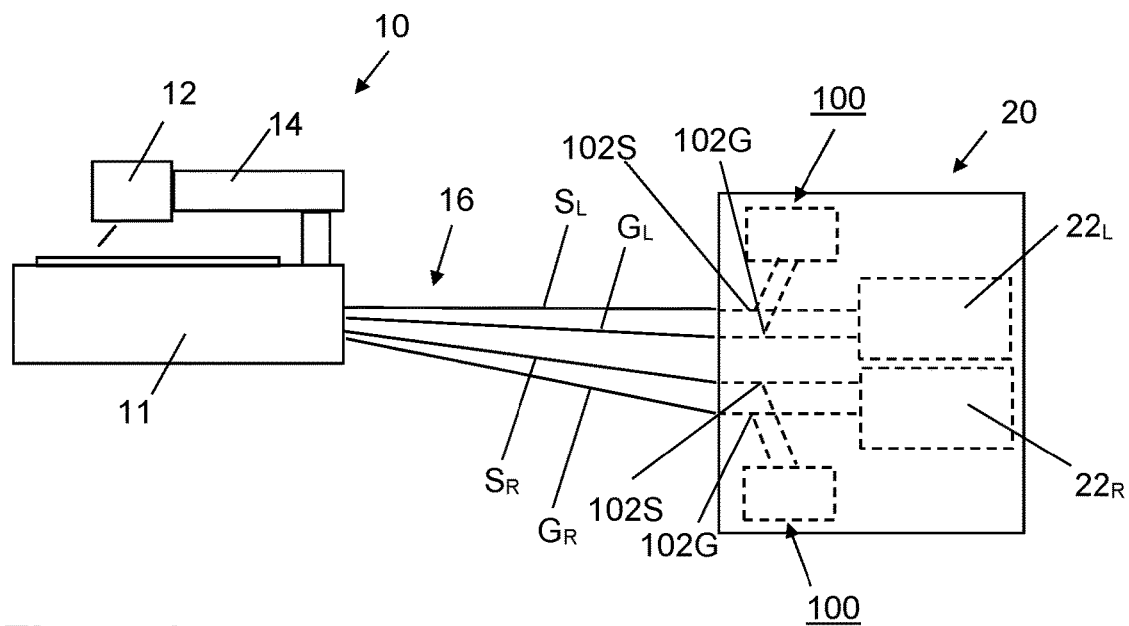
FIG. 1 is a simplified block diagram illustrating a stereo record player connected to an amplifying unit employing a phono cartridge transmission line impedance matching system according to a preferred embodiment of the invention.

Referring to FIGS. 1 to 9 a phono cartridge transmission line impedance matching system 100 according to a preferred embodiment of the invention is provided. The matching system 100 is, for example, incorporated in an amplifying unit 20, such as a pre-amplifier unit, connected to a stereo record player 10, as illustrated in FIG. 1. Alternatively, the matching system 100 may be provided as a stand-alone unit interposed between the record player 10 and the amplifying unit 20. The matching system 100 matches the impedance of phono cartridge 12 and its transmission line connected to respective amplifiers 22L and 22R of the amplifying unit 20. The transmission line comprises cabling through tone-arm 14 and housing 11 of the record player 10 as well as cabling 16 connecting the record player 10 to the amplifying unit 20. The cabling comprises a signal line $S_L$, $S_R$ and a ground line $G_L$, $G_R$ for each of a left hand side channel and a right hand side channel of the stereo record player 10, respectively. Two matching systems 100 are employed with one matching system 100 being connected to the signal line $S_L$, $S_R$ and the ground line $G_L$, $G_R$ of each of the left hand side stereo channel and the right hand side stereo channel via connecting port 102S, 102G. Since the two matching systems 100 for matching the two stereo channels are the same, the description hereinbelow will be limited to a single matching system 100 for simplicity.

Figure 2:
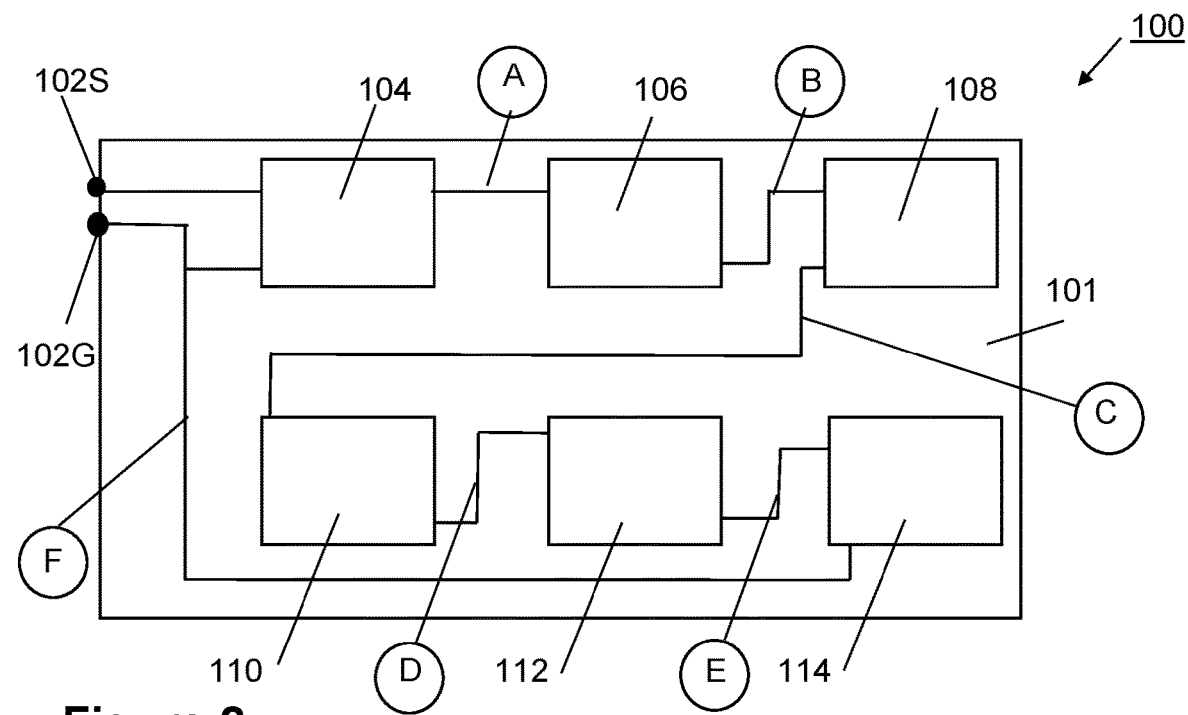
FIG. 2 is a simplified block diagram illustrating the phono cartridge transmission line impedance matching system according to the preferred embodiment of the invention.

Referring to FIG. 2, the matching system 100 comprises a connecting port 102S, 102G adapted for being connected to a signal line $S_L$, $S_R$ and a ground $G_L$, $G_R$ line of one of the left hand side stereo channel and the right hand side stereo channel. Capacitance switching circuit 104 is connected to the signal line portion 102S and the ground line portion 102G of the connecting port 102S, 102G in a parallel fashion. The capacitance switching circuit 104 is adapted to enable a user to selectively switch between different capacitances. A plurality of resistance switching circuits, for example, five resistance switching circuits 106, 108, 110, 112, and 114, as illustrated in FIG. 2, are connected with each other in a serial fashion via connecting lines B, C, D, and E between successive resistance switching circuits. The first resistance switching circuit 106 is connected to the signal line of the capacitance switching circuit 104 via connecting line A and the last resistance switching circuit 114 is connected to the ground line via connecting line F such that the series of resistance switching circuits 106, 108, 110, 112, and 114 is connected to the signal line and the ground line in a parallel fashion. Each resistance switching circuit 106, 108, 110, 112, and 114 is adapted to enable the user to selectively switch between different resistance-load values.

Figure 3:
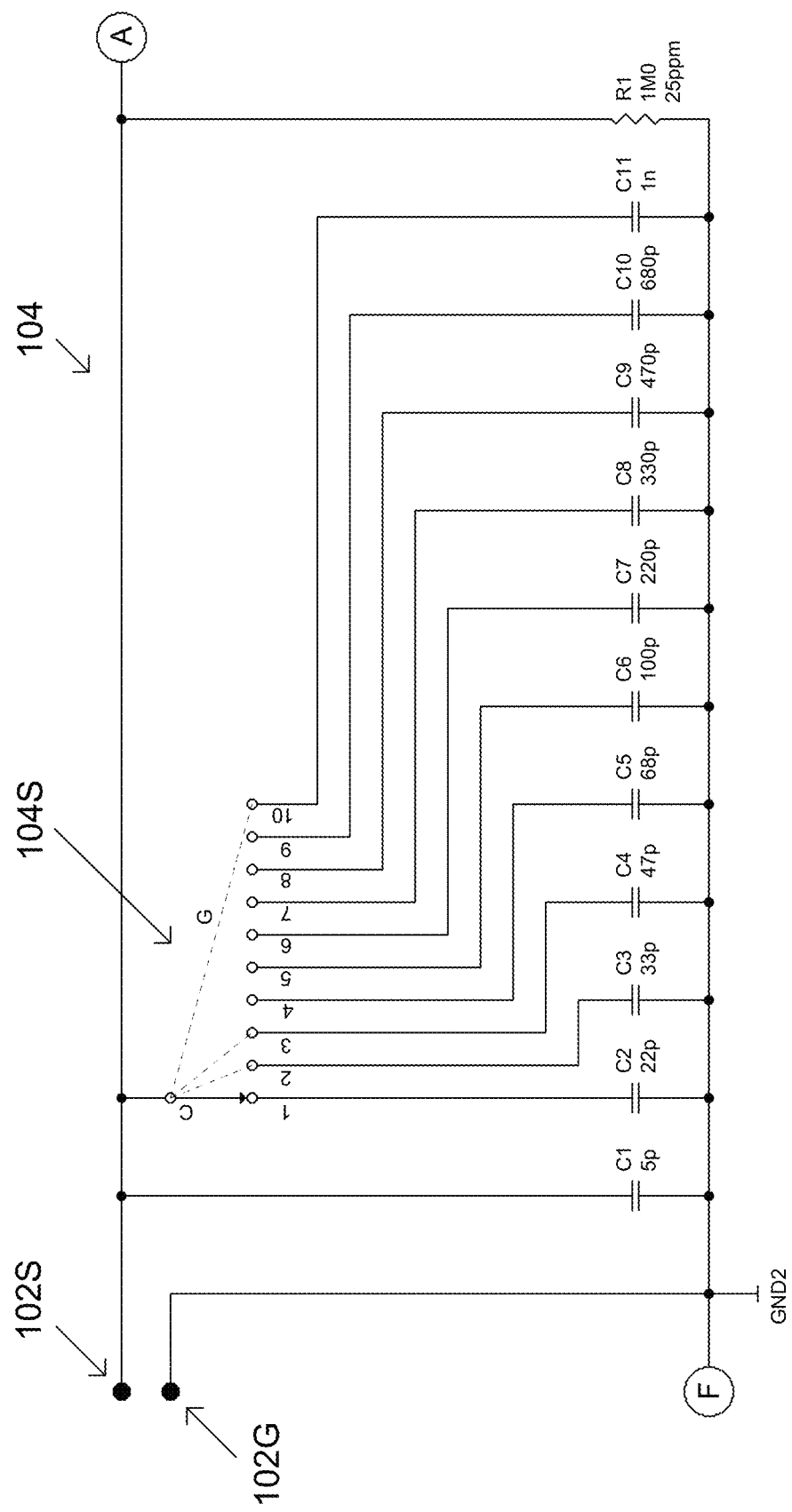
FIG. 3 is a simplified block diagram illustrating a capacitance switching circuit of the phono cartridge transmission line impedance matching system according to the preferred embodiment of the invention.
Figure 4:
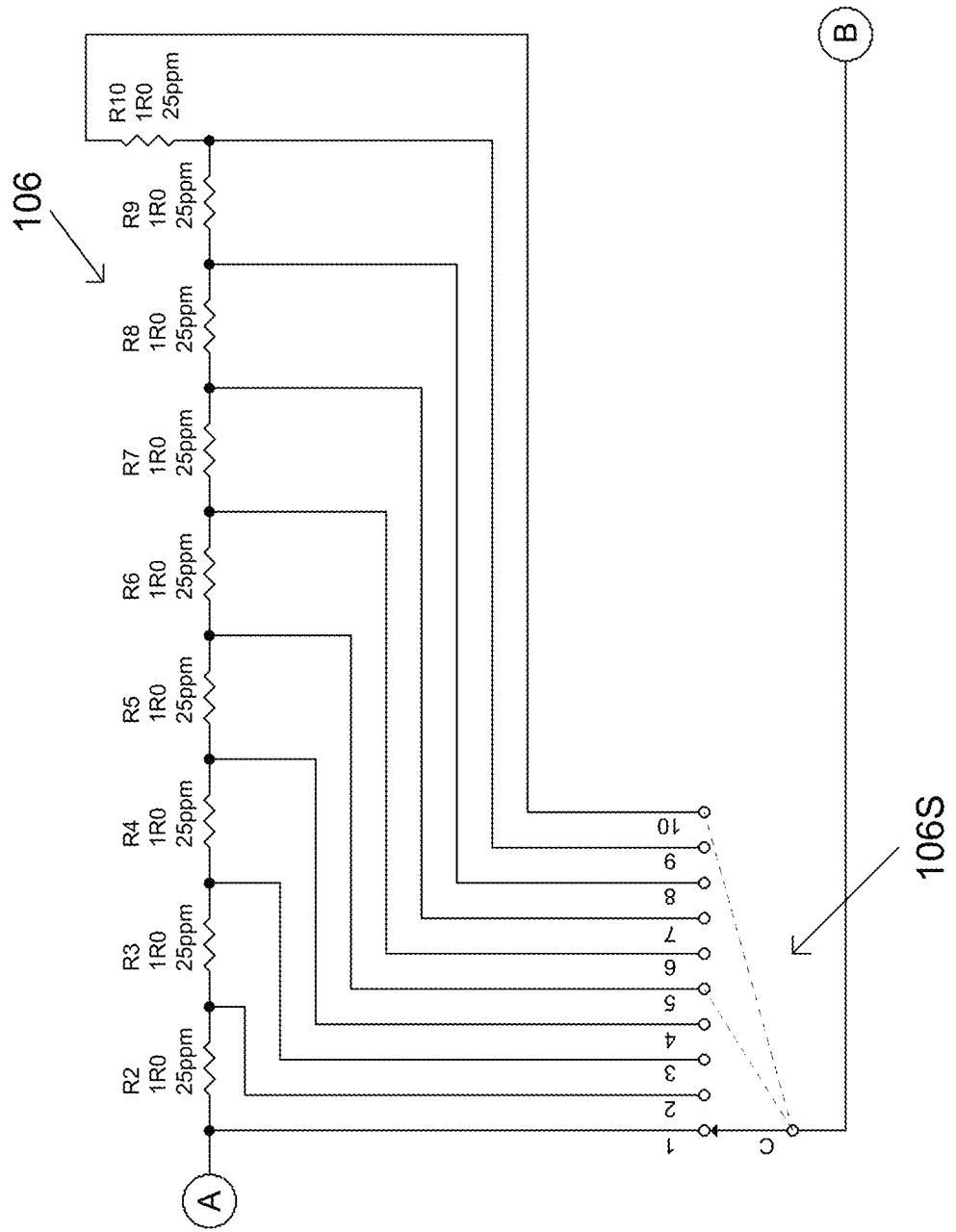
FIGS. 4 to 8 are simplified block diagrams illustrating resistance switching circuits of the phono cartridge transmission line impedance matching system according to the preferred embodiment of the invention; and, FIG. 9 is a simplified block diagram illustrating in front view a user interface of the phono cartridge transmission line impedance matching system according to the preferred embodiment of the invention.
Figure 5:
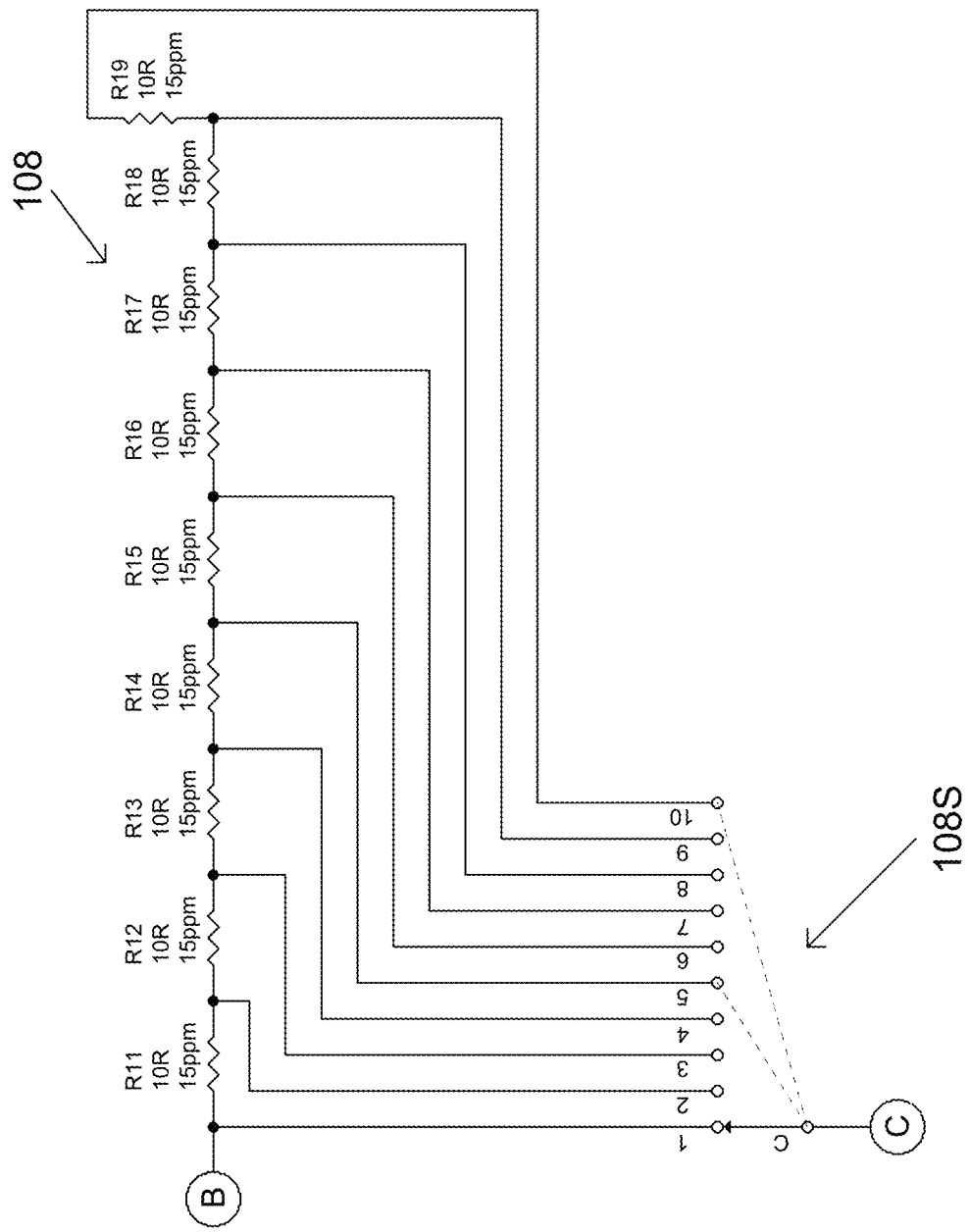
Figure 6:
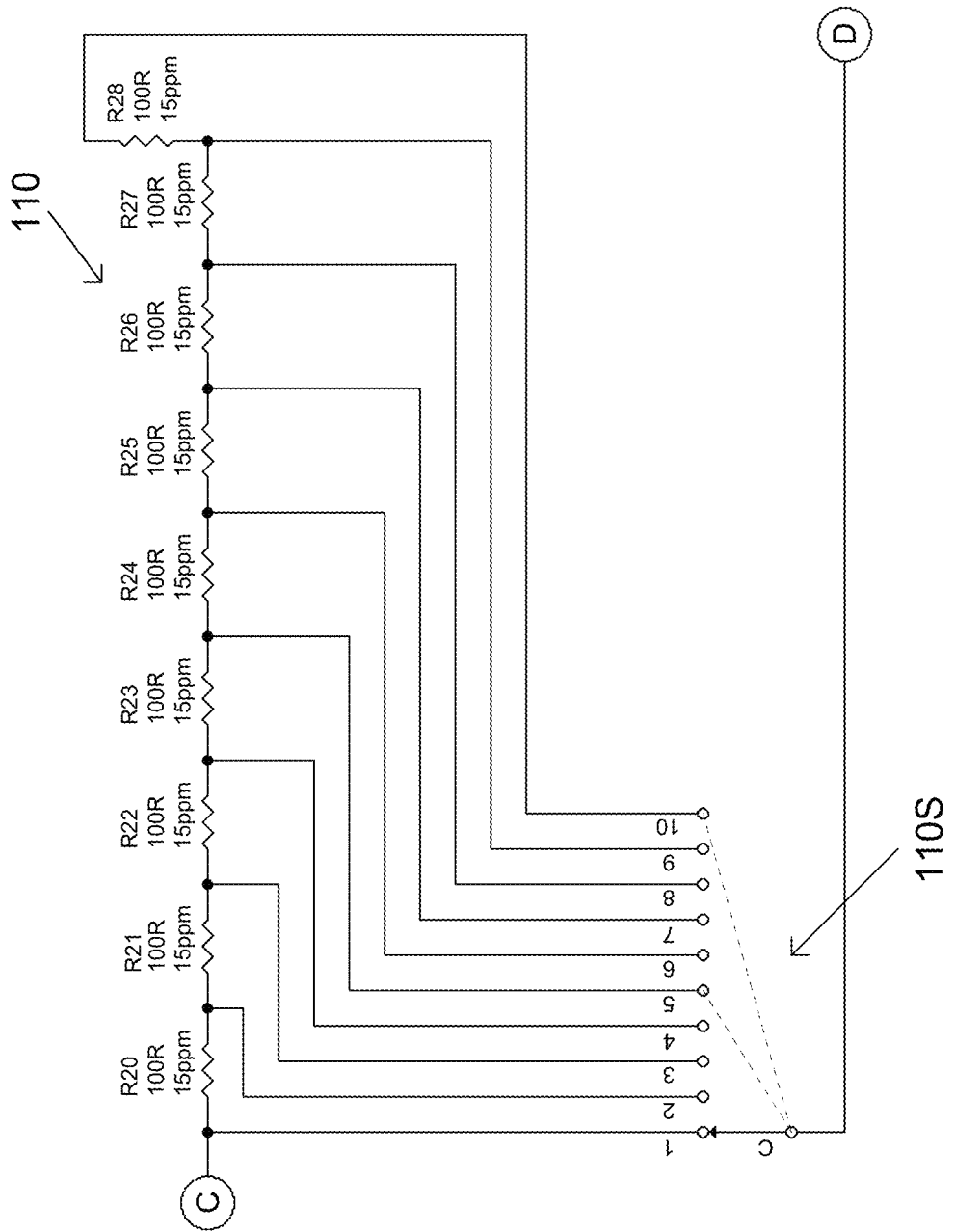

Preferably, the matching system 100 comprises an input shunt resistor R1 interposed between the signal line and ground, as illustrated in FIG. 3. The input shunt resistor R1 directly parallels a large value resistance such as, for example, 1 M $\Omega$, between the signal-line and a quiet (non-power connection) ground GND2. Although this technique is more complex when determining the individual resistors of the resistance switching circuits 106, 108, 110, 112, and 114, it ensures a quiet transition between resistance-load selections by the user, therefore, enabling the user to change the resistance-load during record play.

Referring to FIG. 3, the capacitance switching circuit 104 comprises an input capacitor C1 having a capacitance of, for example, 5 pF, connected to the signal line and the ground line in a parallel fashion, followed by a plurality of capacitors such as, for example, ten capacitors C2-C11 and a multi position selector switch 104S for selectively connecting one of the capacitors C2-C11 to the signal line and the ground line in a parallel fashion. For example, each of the capacitors C2-C11 is connected to the ground line and to the selector switch 104S for selectively connecting one of the capacitors C2-C11 to the signal line, as illustrated in FIG. 3. Alternatively, each of the capacitors C2-C11 may be connected to the signal line and to the selector switch 104S for selectively connecting one of the capacitors C2-C11 to the ground line.

Preferably, the capacitance switching circuit 104 comprises ten capacitors C2-C11 having capacitances of 22 pF, 33 pF, 47 pF, 68 pF, 100 pF, 220 pF, 330 pF, 470 pF, 680 pF, and 1 nF, respectively, in order to meet the most common capacitance values recommended by manufacturers of commercially available phono cartridges.

Referring to FIGS. 4 to 8, each of the resistance switching circuits 106, 108, 110, 112, and 114 comprises a plurality of resistors connected in series to the signal line and a respective multi position selector switch 106S, 108S, 110S, 112S, and 114S connected to: nodes between adjacent resistors, a first node before the first resistor of the plurality of resistors; and a last resistor of the plurality of resistors, with the nodes being indicated by black circles in FIGS. 4 to 8. The multi position selector switches 106S, 108S, 110S, 112S, and 114S are adapted for selectively connecting one of the nodes to a respective switching output. The switching output of each of the resistance switching circuits 106, 108, 110, and 112 is connected to the first node of a successive resistance switching circuit via respective connecting lines B, C, D, and E, and the switching output of the resistance switching circuit 114 is connected to the ground line via connecting line F.

Alternatively, the resistors of each of the resistance switching circuits 106, 108, 110, 112, and 114 may be connected to the ground line and the switching output of the resistance switching circuit 114 may be connected to the signal line.

Preferably, the resistors of the resistance switching circuits 106, 108, 110, 112, and 114 are determined such that the resistance-load values of successive resistance switching circuits increase by an order of ten, and each resistance switching circuit 106, 108, 110, 112, and 114 switches between ten resistance-load values (including zero) in equal increments. For example, the resistors of the resistance switching circuits: 106 are determined such that the user is enabled to increase the resistance-load value from 0$\Omega$ to 9$\Omega$ in 1$\Omega$ increments; 108 are determined such that the user is enabled to increase the resistance-load value from 0$\Omega$ to 90$\Omega$ in 10$\Omega$ increments; 110 are determined such that the user is enabled to increase the resistance-load value from 0$\Omega$ to 900$\Omega$ in 100$\Omega$ increments; 112 are determined such that the user is enabled to increase the resistance-load value from 0$\Omega$ to 9 k $\Omega$ in 1 k $\Omega$ increments; and 114 are determined such that the user is enabled to increase the resistance-load value from 0$\Omega$ to 90 k $\Omega$ in 10 k $\Omega$ increments, consequently, providing 99,999 switching options between 0$\Omega$ and 99,999$\Omega$ in 1$\Omega$ increments, as illustrated in FIG. 9.

The matching system 100 enables accurate matching of the impedance of a phono cartridge and its transmission line connected to an amplifying device by enabling precise adjustment of the resistance-loading of a phono cartridge 12 connected to an amplifying device 20 during normal record play. Furthermore, by providing 99,999 switching options the matching system 100 enables precise adjustment of the resistance loading of a phono cartridge 12 connected to an amplifying device 20 during normal record play for a large variety of commercially available phono cartridges of different types such as, for example, moving magnet cartridges, moving iron cartridges, and moving coil cartridges.

As is evident to those skilled in the art, the matching system 100 is not limited thereto, but may be implemented using a different number of switches, a different number of selections per switch, different resistance-load values per switch, and different increments, depending on design preferences. For example, to ensure resistance-load matching compatibility with not only all presently commercially available moving-coil cartridges, moving-magnet cartridges, and moving-iron phono cartridges, but also some of the unique load-matching requirements for crystal cartridges, ceramic (piezoelectric effect) cartridges, and high-precision strain gauge cartridges, increasing the number of resistance switching circuits to, for example, six, increases the number of user selectable resistance-load values from 99,999 to 999,999 in a range from 0Ω to 999,999Ω in 1Ω increments.

Figure 9:
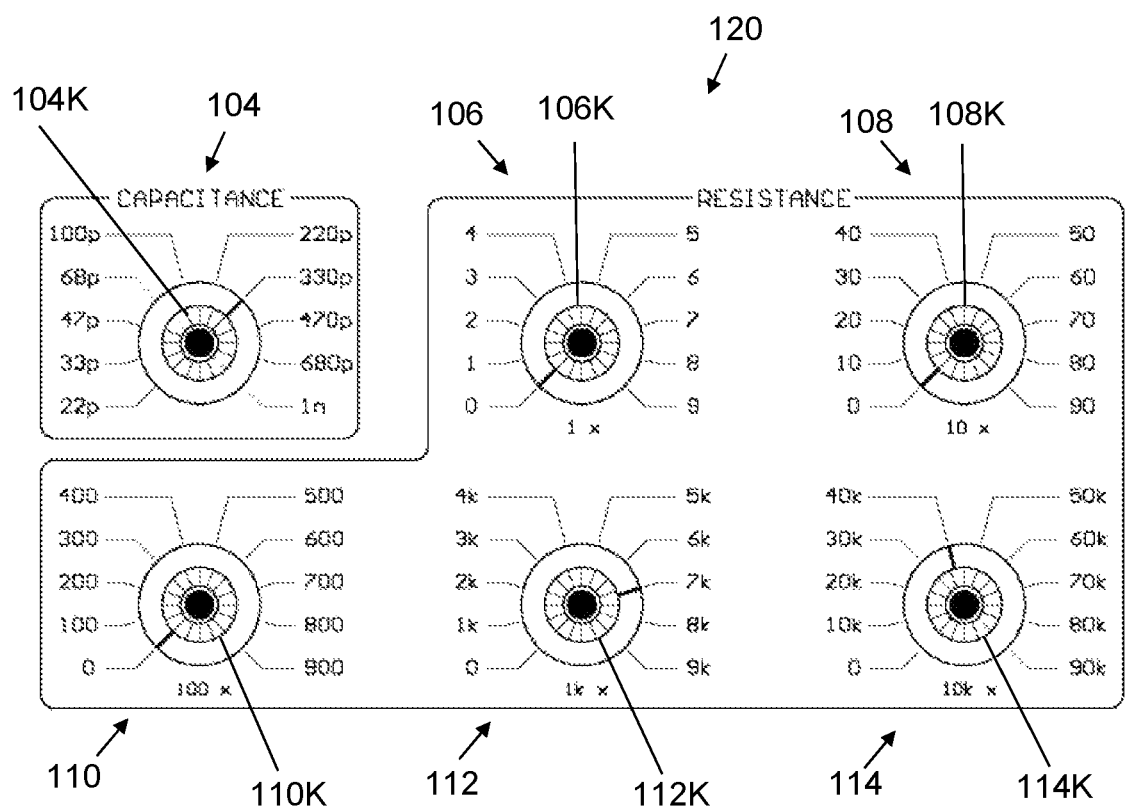

Preferably, each of the multi position selector switches 104S, 106S, 108S, 110S, 112S, and 114S is provided as a rotary switch having a respective control knob 104K, 106K, 108K, 110K, 112K, and 114K such that control knob position is indicative of a respective capacitance or resistance-load value, enabling the user to directly read the respective values by the multi-position selector switch control-knob positions, as illustrated in FIG. 9. This is in contrast to presently commercially available products that use Dual In-line Package (DIP) switches instead of rotary switches, which often require a truth table to decode the toggled values, in order to calculate the selected values. The matching system 100 is implemented, for example, on a Printed Circuit Board (PCB) 101, with the multi position selector switches 104S, 106S, 108S, 110S, 112S, and 114S being disposed thereon such that their locations correspond to respective locations of their respective knobs 104K, 106K, 108K, 110K, 112K, and 114K on the user interface 120, as illustrated in FIG. 9.

Figure 7:
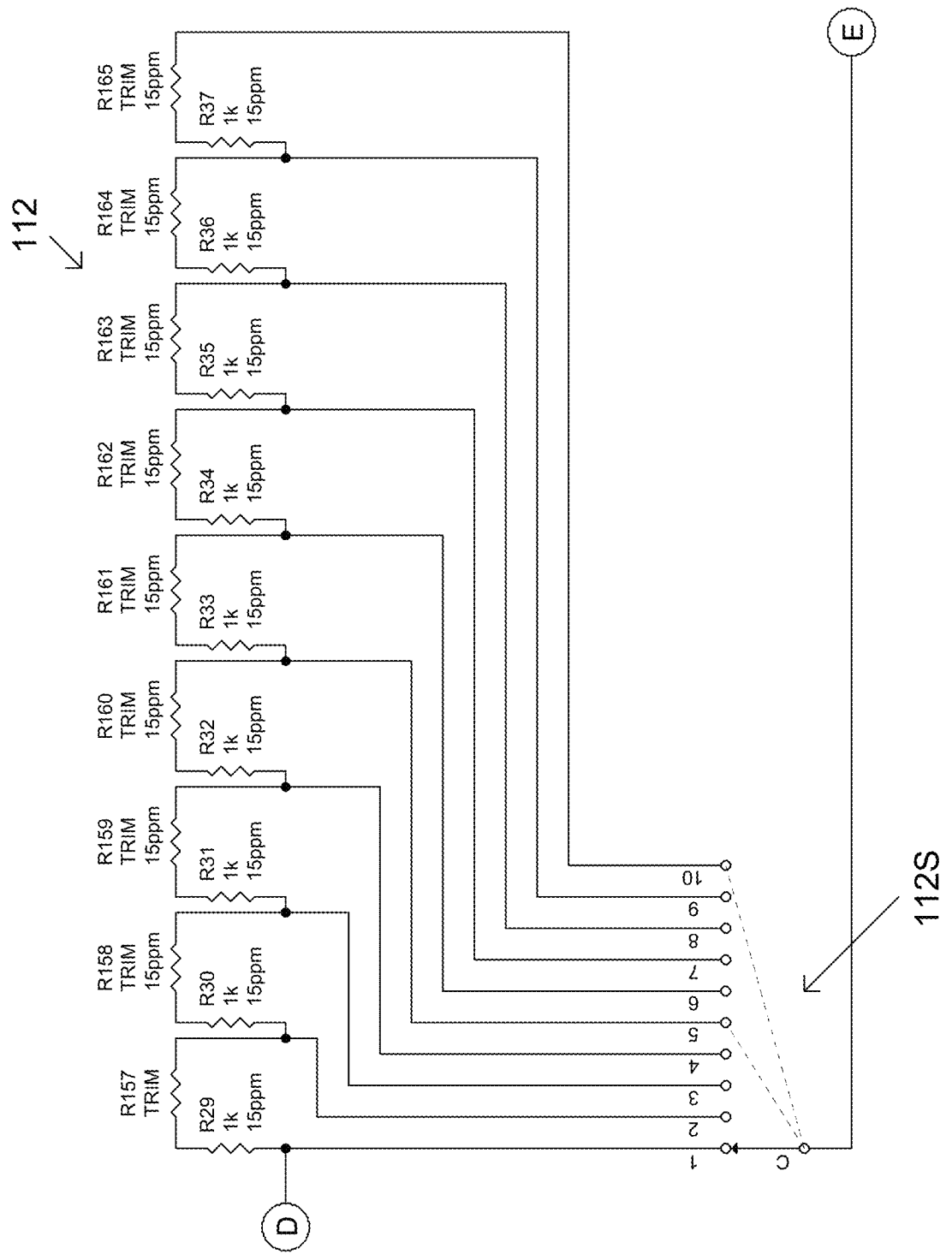
Figure 8:
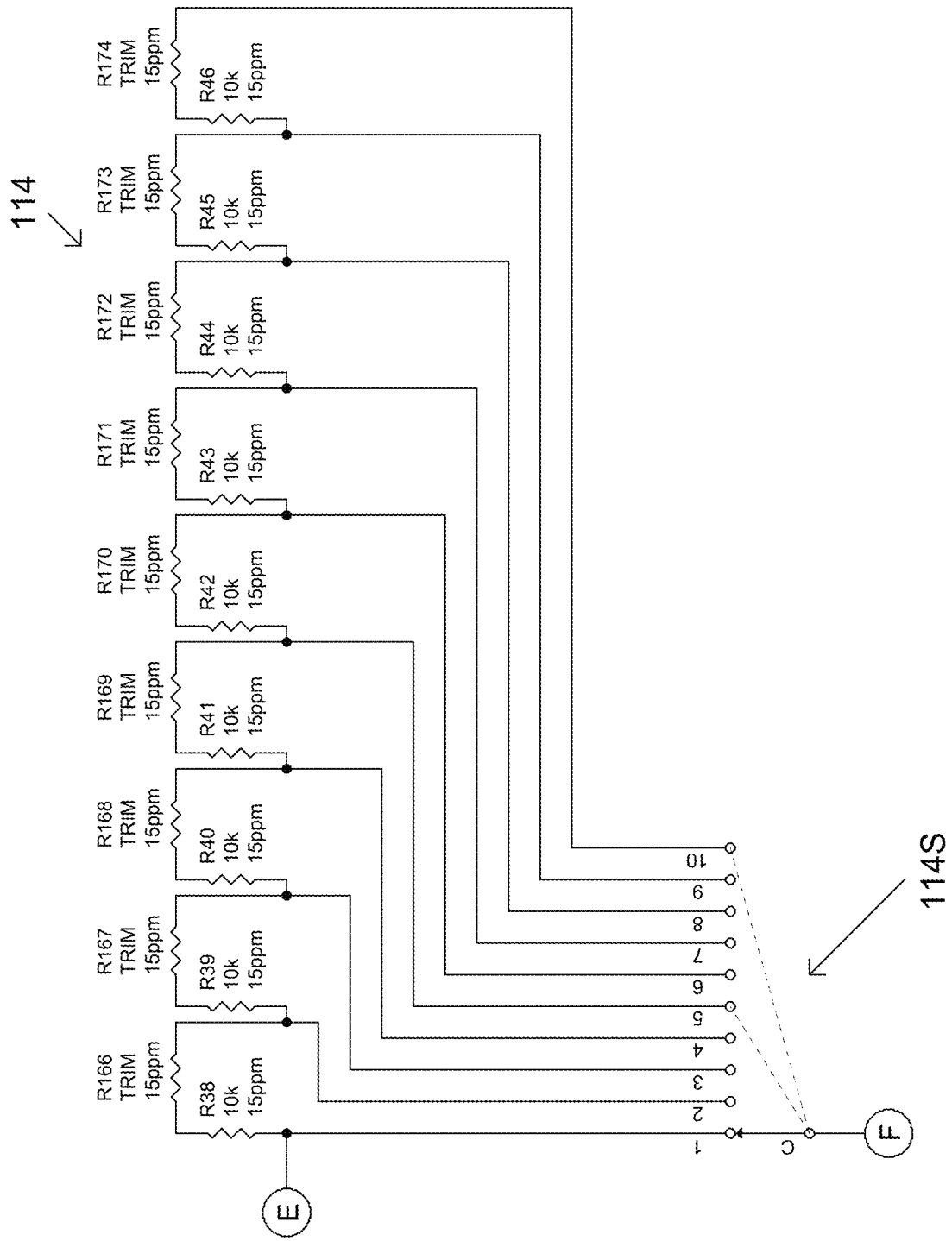

Preferably, to ensure reliable and predictable operation, the resistance switching circuits 106, 108, 110, 112, and 114 are implemented using commercially available resistors that have low thermal noise, low current noise, and a low temperature coefficient of, for example, 25 ppm or less. Further preferably, to reduce thermal drift, and to improve accuracy, larger resistance values are implemented by using two smaller resistance value resistors connected in series, as illustrated in FIGS. 7 and 8 for the resistance switching circuits 112 and 114.

The matching system 100 enables user-selectable adjustments that are operationally, and sonically, unobtrusive, i.e. without circuit interruptions due to open circuit voltage level shifts, thus avoiding thumps, or other disruptive noises that would otherwise occur if the input of amplifying circuitry were to be disconnected, even momentarily. This is accomplished by configuring all of the connected multi-position selector resistance switches in series, including all of the individual resistors. The use of a series connected configuration provides several advantages:

1) readily available non-shorting rotary switches can be used, which ensure consistent manufacturability;
2) calculation of the user-selectable adjustments, is the sum of the individual values; and,
3) no noise disruptions caused by open circuit voltage shifts.

The matching system 100 enables user to optimize resistance-load matching for most phono cartridges, without adding any hum and noise, or audio distortion products during normal record play, regardless of the positions of the multi position selector switches, or how often these switches are adjusted during normal record play. The optimized resistance-load matching provides improved dynamic resolution, lower high-frequency peaking or ringing, and an improved low-frequency extension.

Using the matching system 100 the user is enabled to achieve the phono cartridge transmission line impedance matching in a number of easy steps:

1) using the capacitance switching circuit 104 and the resistance switching circuits 106, 108, 110, 112, and 114, the capacitance value and the resistance value are set to respective values recommended by a manufacturer of the phono cartridge;
2) using the phono cartridge, playing a variety of records and while listening to the record playback take note of any dynamic compression, or anomalous resonances, such as high-frequency ringing, or a truncated or bloated low-frequency response; and,
3) using the plurality of resistance switching circuits, adjusting the resistance-load value while listening to the record playback until the phono cartridge transmission line impedance is matched.

The present invention has been described herein with regard to preferred embodiments. However, it will be obvious to persons skilled in the art that a number of variations and modifications can be made without departing from the scope of the invention as described herein.

What is claimed is:

1. A phono cartridge transmission line impedance matching system comprising:
   a connecting port adapted for being connected to a signal line and a ground line of a phono cartridge transmission line;
   a capacitance switching circuit connected to the signal line and the ground line in a parallel fashion, the capacitance switching circuit for selectively switching between different capacitances; and,
   a plurality of resistance switching circuits connected with each other in a serial fashion and connected to the signal line and the ground line in a parallel fashion, each resistance switching circuit for selectively switching between different resistance-load values.

2. The system according to claim 1 comprising an input shunt resistor interposed between the signal line and ground in a parallel fashion.

3. The system according to claim 2 wherein each resistance switching circuit comprises a plurality of resistors connected in series and a multi position selector switch connected to: nodes between adjacent resistors, a first node before a first resistor of the plurality of resistors; and a last resistor of the plurality of resistors, the multi position selector switch being adapted for selectively connecting one of the nodes to a switching output.

4. The system according to claim 3 wherein the switching output of the last resistance switching circuit of the plurality of resistance switching circuits is connected to ground and wherein the switching output of each of the other resistance switching circuits is connected to the first node of a successive resistance switching circuit.

5. The system according to claim 1 wherein the resistors of the resistance switching circuits are determined such that the resistance values of successive resistance switching circuits increase by an order of ten.

6. The system according to claim 5 wherein each resistance switching circuit switches between 10 resistance values in equal increments.

7. The system according to claim 3 wherein the multi position selector switch of each resistance switching circuit comprises a rotary switch.

8. The system according to claim 7 wherein the rotary switch comprises a control knob and wherein a control knob position is indicative of a respective resistance value.

9. The system according to claim 3 wherein the resistors have low thermal noise, low current noise, and a low temperature coefficient.

10. A phono cartridge transmission line impedance matching method comprising:
   providing a phono cartridge transmission line impedance matching system comprising:
      a connecting port connected to a signal line and a ground line of one of a left or a right phono cartridge transmission line;
      a capacitance switching circuit connected to the signal line and the ground line in a parallel fashion, the capacitance switching circuit for selectively switching between different capacitances; and,
      a plurality of resistance switching circuits connected with each other in a serial fashion and connected to the signal line and the ground line in a parallel fashion, each resistance switching circuit for selectively switching between different resistances;
   using the capacitance switching circuit and the plurality of resistance switching circuits, setting the capacitance value and the resistance value to respective values recommended by a manufacturer of the phono cartridge;
   using the phono cartridge, playing a record and listening to the record playback; and,
   using the plurality of resistance switching circuits, adjusting the resistance value while listening to the record playback until the phono cartridge transmission line impedance is matched.

11. The method according to claim 10 wherein listening comprises listening for dynamic compression and anomalous resonances.

* * * * *